United States Patent
Xie et al.

(10) Patent No.: US 12,075,627 B2
(45) Date of Patent: Aug. 27, 2024

(54) AI ACCELERATOR WITH MRAM, PCM, AND RECESSED PCM BOTTOM ELECTRODE

(71) Applicant: International Business Machines Corporation, Armonk, NY (US)

(72) Inventors: Ruilong Xie, Niskayuna, NY (US); Alexander Reznicek, Troy, NY (US); Wei Wang, Yorktown Heights, NY (US); Tao Li, Slingerlands, NY (US); Tsung-Sheng Kang, Ballston Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 374 days.

(21) Appl. No.: 17/412,776

(22) Filed: Aug. 26, 2021

(65) Prior Publication Data

US 2023/0066107 A1   Mar. 2, 2023

(51) Int. Cl.
*H10B 61/00* (2023.01)
*G11C 11/15* (2006.01)
(Continued)

(52) U.S. Cl.
CPC ............ *H10B 61/00* (2023.02); *G11C 11/15* (2013.01); *H10B 61/10* (2023.02); *H10N 50/01* (2023.02);
(Continued)

(58) Field of Classification Search
CPC ........ H10B 61/00; H10B 61/10; G11C 11/15; G11C 11/005; G11C 13/0004; H10N 50/01; H10N 50/85
(Continued)

(56) References Cited

U.S. PATENT DOCUMENTS 8,174,875 B2   5/2012   Baek et al.
8,981,326 B2 * 3/2015   BrightSky ............ H10N 70/011
                                                            438/102
(Continued)

FOREIGN PATENT DOCUMENTS

CN   102142442 B   3/2016
KR   100629388 B1   9/2006
(Continued)

OTHER PUBLICATIONS

Gokmen et al., "Acceleration of Deep Neural Network Training with Resistive Cross-Point Devices: Design Considerations," Frontiers in Neuroscience, Jul. 21, 2016, 13 pages http://journal.frontiersin.org/article/10.3389/fnins.2016.00333/abstract.
(Continued)

*Primary Examiner* — Jami Valentine Miller
(74) *Attorney, Agent, or Firm* — Peter J. Edwards

(57) ABSTRACT

An integrated circuit, a system, and a method to integrate phase change memory and magnetoresistive random access memory within a same integrated circuit in a system. The integrated circuit may include an MRAM and a PCM. The MRAM may include an MRAM bottom electrode, an MRAM stack, and an MRAM top electrode. The PCM may include a PCM bottom electrode, where the PCM bottom electrode has a lower height than the MRAM bottom electrode, a phase change material, and a PCM top electrode.

19 Claims, 16 Drawing Sheets

(51) Int. Cl.
  *H10N 50/01* (2023.01)
  *H10N 50/85* (2023.01)
  *G11C 11/00* (2006.01)
  *G11C 13/00* (2006.01)

(52) U.S. Cl.
  CPC ............ *H10N 50/85* (2023.02); *G11C 11/005* (2013.01); *G11C 13/0004* (2013.01)

(58) Field of Classification Search
  USPC ........................................................ 257/421
  See application file for complete search history.

(56) References Cited

U.S. PATENT DOCUMENTS

| | | | |
|---|---|---|---|
| 9,019,777 B2 | 4/2015 | Nakai et al. | |
| 9,299,804 B2 | 3/2016 | Lam et al. | |
| 10,134,457 B1 | 11/2018 | Mihajlovic et al. | |
| 10,217,505 B1 | 2/2019 | Apodaca et al. | |
| 10,573,811 B2 | 2/2020 | Tseng et al. | |
| 10,896,726 B2 | 1/2021 | Kim | |
| 11,335,812 B2* | 5/2022 | Yamazaki | H01L 27/10 |
| 11,843,059 B2* | 12/2023 | Yamazaki | H01L 27/10 |
| 2019/0386203 A1* | 12/2019 | Gosavi | H10N 50/01 |
| 2020/0020626 A1* | 1/2020 | Yang | H01L 21/76883 |
| 2021/0020508 A1* | 1/2021 | Briggs | H10B 63/80 |
| 2021/0066580 A1 | 3/2021 | Song et al. | |
| 2021/0305494 A1* | 9/2021 | Dutta | H10N 50/10 |

FOREIGN PATENT DOCUMENTS

| | | |
|---|---|---|
| KR | 20100041139 A | 4/2010 |
| TW | I415299 B | 11/2013 |
| WO | 2023025597 A1 | 3/2023 |

OTHER PUBLICATIONS

International Search Report and Written Opinion, International Application No. PCT/EP2022/072546, Dated Dec. 16, 2022, 11 pages.

* cited by examiner

AI ACCELERATOR WITH MRAM, PCM, AND RECESSED PCM BOTTOM ELECTRODE

BACKGROUND

The present disclosure relates to phase change memory and, more specifically, to integrating phase change memory and magnetoresistive random access memory at a same metal level (i.e., within a same integrated circuit) within a system.

Phase change memory (PCM) is a non-volatile random access memory (NVRAM). PCMs contain phase-change materials (such as alloys containing Tellurium) and may alter the states (e.g., crystalline and amorphous phases) of the PCM using heat. The phase-change materials may be placed between two electrodes, and when the phase-change materials are in a crystalline state the phase-change materials have a high conductivity and a low resistivity (which corresponds to a logical 1), allowing current to travel quickly thorough the phase-change materials and between electrodes. When the phase-change materials are in an amorphous state, the materials have a low conductivity and a high resistivity (which corresponds to a logical 0), preventing current from travelling quickly through the phase-change materials and between the electrodes. The portions of the phase-change material that are amorphous and crystalline may be controlled to achieve intermediate conductivity values, for use in analog computing. The data is stored using the contrast between resistances of the multiple states. The PCM is a non-volatile memory, as the states can remain if/when power is removed, allowing PCMs to retain data even when there is no power.

Magnetoresistive random access memory (MRAM) is another type of non-volatile random access memory (NVRAM). MRAMs store data through a magnetic tunnel junction (MTJ) configuration. A magnetic tunnel junction configuration includes two ferromagnetic plates separated by a thin insulator layer, with one of the plates being a permanent magnet and the second plate having a changeable magnetization. The MTJ configuration creates electron tunneling and electrons can tunnel from one plate to the other. The amount of tunneling changes the resistance of the MTJ and the data is stored in the MRAM using the changes in resistance.

SUMMARY

The present invention provides an integrated circuit, a system, and a method to integrate phase change memory and magnetoresistive random access memory within a same integrated circuit in a system. The integrated circuit may include an MRAM and a PCM. The MRAM may include an MRAM bottom electrode, an MRAM stack, and an MRAM top electrode. The PCM may include a PCM bottom electrode, where the PCM bottom electrode has a lower height than the MRAM bottom electrode, a phase change material, and a PCM top electrode.

The system may include an integrated circuit. The integrated circuit may include an MRAM and a PCM. The MRAM may include an MRAM bottom electrode, and an MRAM stack. The PCM may include a PCM bottom electrode, where the PCM bottom electrode has a lower height than the MRAM bottom electrode, and a phase change material. The integrated circuit may also include a computation unit in a close proximity to the integrated circuit.

The method of forming the integrated circuit may include forming a first bottom electrode in a first portion of a dielectric layer, resulting in a PCM bottom electrode. The method may also include forming a second bottom electrode in a second portion of the dielectric layer, resulting in an MRAM bottom electrode, where the second portion of the dielectric layer is on a same level as the first portion. The method may also include recessing the PCM bottom electrode, where the recessed PCM bottom electrode has a lower height than the MRAM bottom electrode. The method may also include forming an MRAM stack proximately connected to the MRAM bottom electrode. The method may also include depositing a phase change material proximately connected to the recessed PCM bottom electrode.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
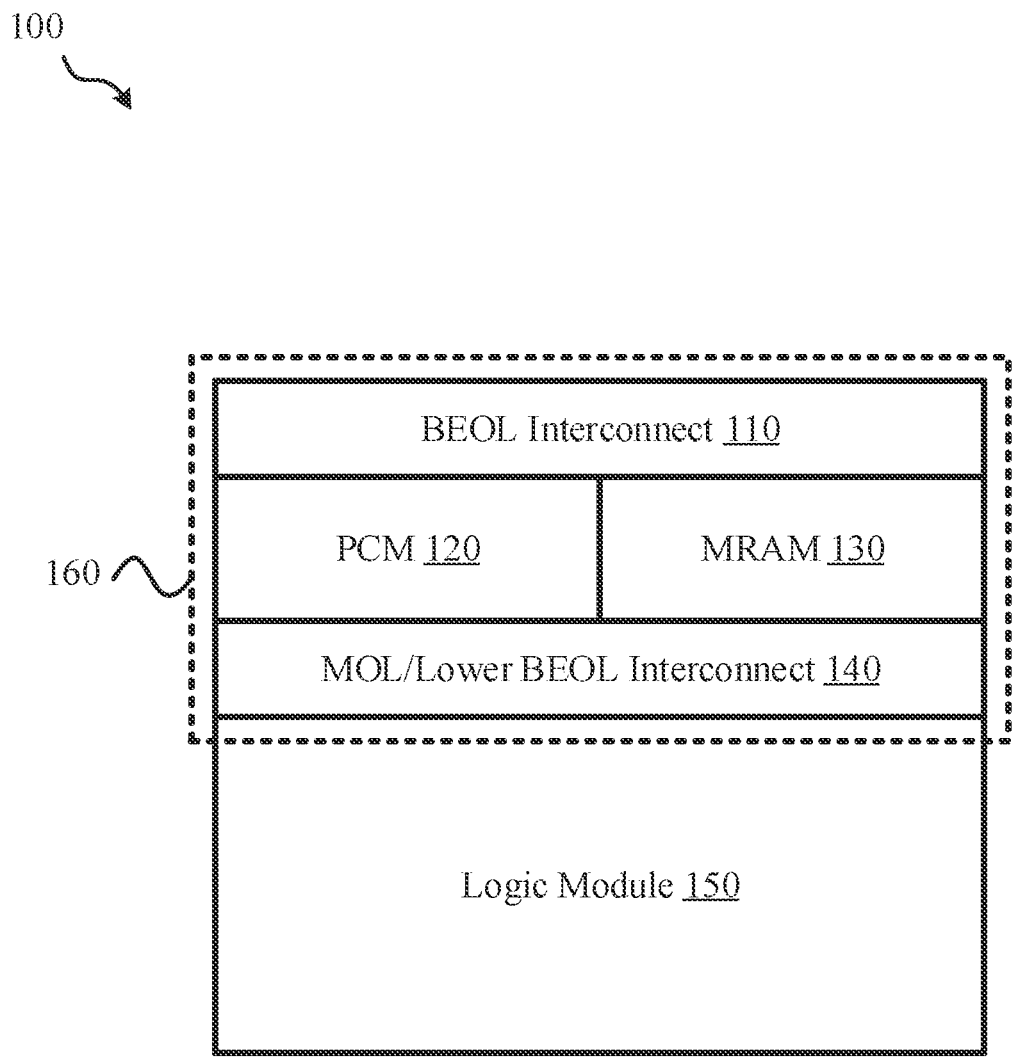
FIG. 1 depicts a schematic diagram of an example AI accelerator with the PCM and MRAM within a same integrated circuit, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to phase change memory and, more specifically, to integrating phase change memory and magnetoresistive random access memory at a same metal level within a system. While the present disclosure is not necessarily limited to such applications, various aspects of the disclosure may be appreciated through a discussion of various examples using this context.

In artificial intelligence (AI) hardware, an accelerator is used to accelerate AI applications, and in AI accelerators the majority of the processing is done near and/or in the memory in order to accelerate the processing. To withstand processing near and/or in the memory, some AI accelerator configurations include both a high density memory and a non-volatile resistive memory. A high density memory has a high amount of memory per individual memory chip, which allows for more storage on a single memory chip. A non-volatile resistive memory, on the other hand, is able to store data without power through changing the resistance of the memory. Having both a high density memory and a non-volatile resistive memory allows an AI accelerator to have a high memory density while also having a non-volatile memory that can store/maintain data with or without power.

One type of non-volatile resistive memory is a phase change memory (PCM). A PCM may include a bottom electrode and a top electrode with a phase change material between the two. As discussed above, conventional phase change memories (PCMs) and their corresponding phase change materials have two states—amorphous and crystalline. The amorphous state may be referred to as a RESET state and the crystalline state may be referred to as a SET state. To switch the phase change material between the two states, the PCM may also include a heater (sometimes called the bottom electrode and/or the bottom electrode contact) that sends current pulses through the heater and into the phase change material. In some embodiments, the heater is the bottom electrode. In some embodiments, the heater is patterned on top of the bottom electrode.

When the phase change material is in a crystalline state, the heater may convert the material into an amorphous state by sending short high current pulses to rapidly heat the phase change material and then quenching or cooling it. When the phase change material is in an amorphous state, the heater may convert the material into a crystalline state by sending a longer, but lower current, pulse(s) to heat the phase change material to a crystallization temperature for a prolonged period of time (without cooling the material) to allow for the material to become crystalline.

When the phase change material (of the phase change memory) is in an amorphous state (or a RESET state, as it is sometimes referred to), the phase change material may have a high resistivity and a low conductivity (i.e., high electrical resistivity and low electrical conductivity), and current may not travel quickly through the phase change material. Alternatively, when the phase change material is in a crystalline state (or a SET state, as it is sometimes referred to), the phase change material may have a low resistivity and a high conductivity (i.e., low electrical resistivity and high electrical conductivity), and current may travel quickly through the phase change material. Data may be stored in the phase change memory (PCM) using the contrast between the resistances of the two states (or phases). For example, each state may correspond to a binary value, with an amorphous state corresponding to a 0 and a crystalline state corresponding to a 1. PCM has many benefits, such as increased speeds (compared to other types of memory), non-volatile capabilities, less power requirements, etc.

Some example high-density memories include dynamic random access memory (DRAM) and magnetoresistive random access memory (MRAM), however MRAM is often faster than DRAM and is also non-volatile (i.e., can store data without power) for longer than DRAM. Therefore, MRAM may be advantageous over DRAM. As discussed above, MRAM uses a magnetic tunnel junction (MTJ) configuration with two ferromagnetic plates (a plate with a permanent magnet (i.e., the fixed plate) and a plate with a changeable magnetization (i.e., the free plate)) and a thin insulator layer separating the two plates. This configuration allows electrons to tunnel from one plate to the other. The magnitude of the resistance of the MTJ and MRAM changes based on the amount of electron tunneling between the two plates. In some instances, MRAMs include a plurality of layers, with the insulator layers separating each permanent magnet and plate with changeable magnetization.

In some embodiments, the amount of electron tunneling (and current transfer) between the layers may be altered by changing the direction of the free plate. Specifically, the free plate(s) may have their direction changed (for example, using magnetic fields or polarized currents) to a same direction or different direction than the fixed plate. When the free plate and the fixed plate have different directions, the amount of electron tunneling between the layers is less and there is a higher resistance between the plates. When the free plate and the fixed plate are in a same direction, the amount of electron tunneling between the layers is higher and there is a lower resistance between the plates. In some instances, when there is a low resistance a logic 0 is stored and when there is a high resistance a logic 1 is stored. MRAM has many advantages including a faster read/write speed, the ability to store data without power (i.e., non-volatile capabilities), no degradation of data over time, and a lower level of power consumption compared to other types of memory.

In conventional AI accelerators, the high-density memory (e.g., MRAM) and the non-volatile resistive memory (e.g., PCM) may be stored on different levels of the AI accelerator as there may be integration challenges in trying to put the memories on the same level. Because of this, at least one of the high-density memory and the non-volatile resistive memory may not be very close to the computation unit. However, it may be desirable to bring the high-density memory closer to the computation unit by integrating it at the same metal level as the non-volatile resistive memory. Having the high-density memory closer to the computation unit may improve the processing speed for the AI accelerator and reduce the energy consumption due to the closer proximity to the processing.

The present disclosure provides an integrated circuit, a system, and a method of integrating phase change memory (PCM) and magnetoresistive random access memory (MRAM) at a same metal level (i.e., within a same integrated circuit) within the system. An integrated circuit includes various electronic components on a single chip. By including both a high-density memory (e.g., MRAM) and a non-volatile resistive memory (e.g., PCM) within an integrated circuit, both memories are on the same chip and are on the same metal level within an AI accelerator. This way, the chip/integrated circuit can be located in a close proximity to the computation unit and the processing within the AI accelerator, which may then improve the processing speed and reduce the energy consumption for the AI accelerator.

Referring now to FIG. 1, an example AI accelerator 100 with a PCM and MRAM within a same integrated circuit is depicted, according to some embodiments. AI accelerator 100 includes an integrated circuit 160 with a back end of line (BEOL) interconnect 110, a PCM 120, an MRAM 130, and either a middle of line (MOL) contact 140 and/or a lower BEOL interconnect 140. AI accelerator 100 may use PCM 120 as its non-volatile resistive memory and may use MRAM 130 as its high-density memory. In integrated circuits, interconnects are used to connect various elements of an integrated circuit (such as integrated circuit 160) with the wiring. Therefore, BEOL interconnect 140 may connect PCM 120 and MRAM 130 and may interconnect both PCM 120 and MRAM 130 with wiring within the integrated circuit 160. A MOL contact may connect transistors (or other front end of line (FEOL) components within an integrated circuit) with BEOL interconnects. Depending on the specifics of the integrated circuit 160, module 140 may be a lower BEOL interconnect, an MOL contact, or a combination of both a lower BEOL interconnect and an MOL contact.

The integrated circuit 160 within the AI accelerator 100 includes BEOL interconnect 110, PCM 120, MRAM 130, and MOL/lower BEOL interconnect 140. In addition to the integrated circuit 160, AI accelerator 100 includes a logic module 150 that is proximately connected to the integrated circuit 160. As used herein, the term "proximately connected" describes a connection between two components in relation the remainder of one of those components. For example, MOL/lower BEOL interconnect 140 may be described as proximately connected to logic module 150 and the integrated circuit 160 as a whole may be described as proximately connected to logic module 150, however BEOL interconnect 110 may not be proximately connected to logic module 150 as there are multiple components separating the two.

With the PCM 120 and MRAM 130 on the same level within the integrated circuit 160, PCM 120 and MRAM 130 are closely connected to logic module 150 (as the integrated circuit 160 is right next to (i.e., proximately connected to) the logic module 150). The PCM 120 and MRAM 130 may only be separated from the logic model 150 by necessary wiring (i.e., BEOL interconnect 140) or other contacts (i.e., MOL 140). In some embodiments, the logic module 150 may be the computation unit (or at least one of the computation units) within the AI accelerator 100. Therefore, by having the integrated circuit 160 proximately connected to the logic module 150, both PCM 120 and MRAM 130 are very closely located to the computation unit within the AI accelerator 100, which may then improve the processing speed and reduce the energy consumption for the AI accelerator 100.

Figure 2:
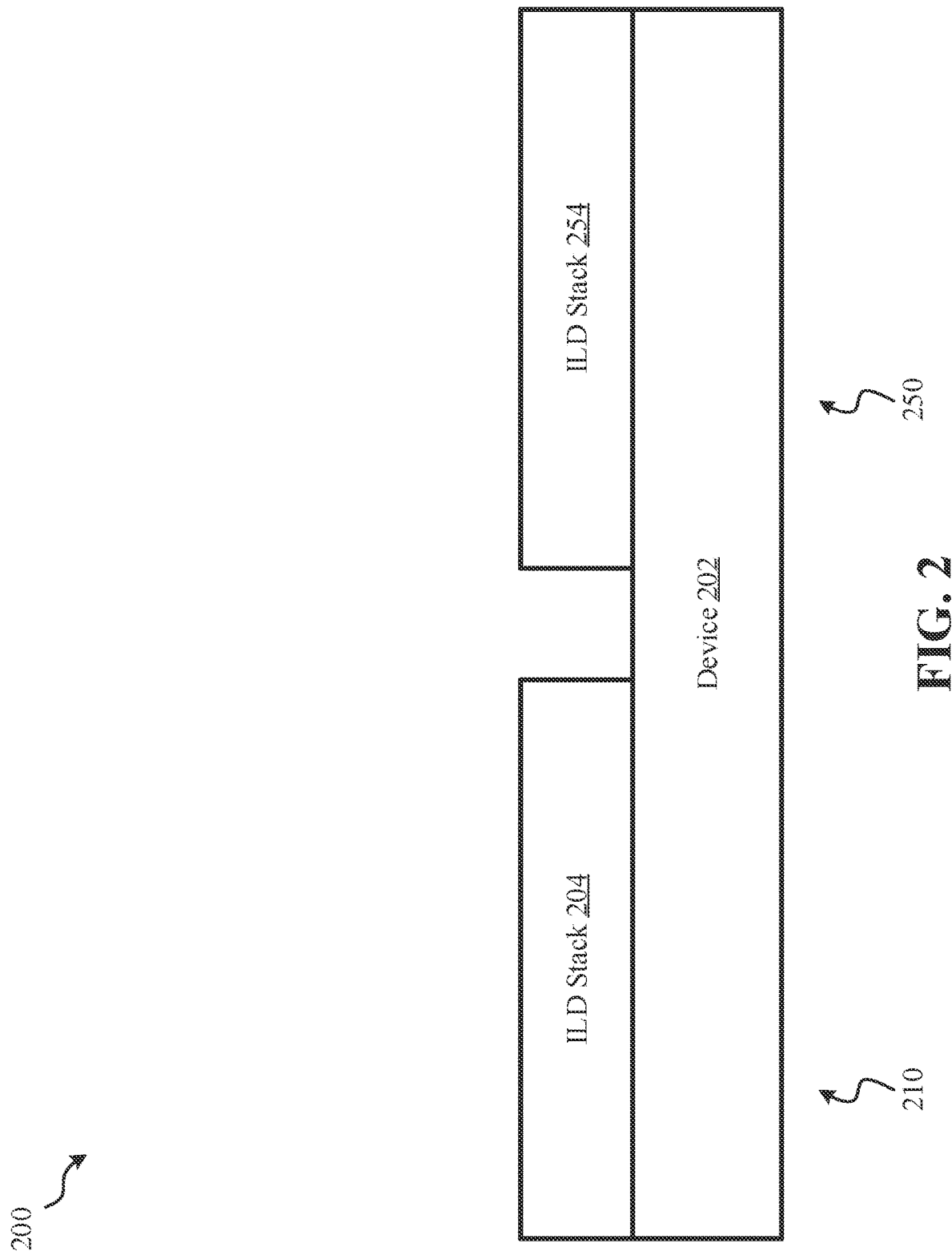
FIG. 2 depicts a schematic diagram of a first intermediate step of forming a first exemplary integrated circuit with both a PCM and MRAM, according to some embodiments.

Referring to FIG. 2, a schematic diagram of a first intermediate step 200 of forming a first exemplary integrated circuit with both a PCM and MRAM is depicted, according to some embodiments. Intermediate step 200 may be an intermediate step in forming integrated circuit 1100 (FIG. 11), in some instances. Intermediate step 200 may include depositing interlayer dielectric (ILD) on top of a device. The interlayer dielectric may be referred to as an ILD stack, herein. Specifically, intermediate step 200 may include depositing ILD stack 204 (for the PCM region 210) and patterning ILD stack 254 (for the MRAM region 250) on top of device 202. Each ILD stack (204 and 254) may be a low-k dielectric used to protect the device 202 from the remaining components of the integrated circuit (not depicted) and to protect the remaining components of the integrated circuit from the device 202. In some embodiments, ILD stacks 204 and 254 may be made up of silicon nitride (SiN), silicon dioxide ($SiO_2$), or any other low-k dielectric material.

In some embodiments, device 202 may represent the remaining device components of an AI accelerator that the integrated circuit is being formed on top of. Device 202 may be separate AI accelerator components, in some instances, or may be the same AI accelerator component, in other instances. For example, device 202 may be logic module 150 (FIG. 1). In other instances, device 202 may be some other computation unit (or computation units) within an AI accelerator.

Figure 3:
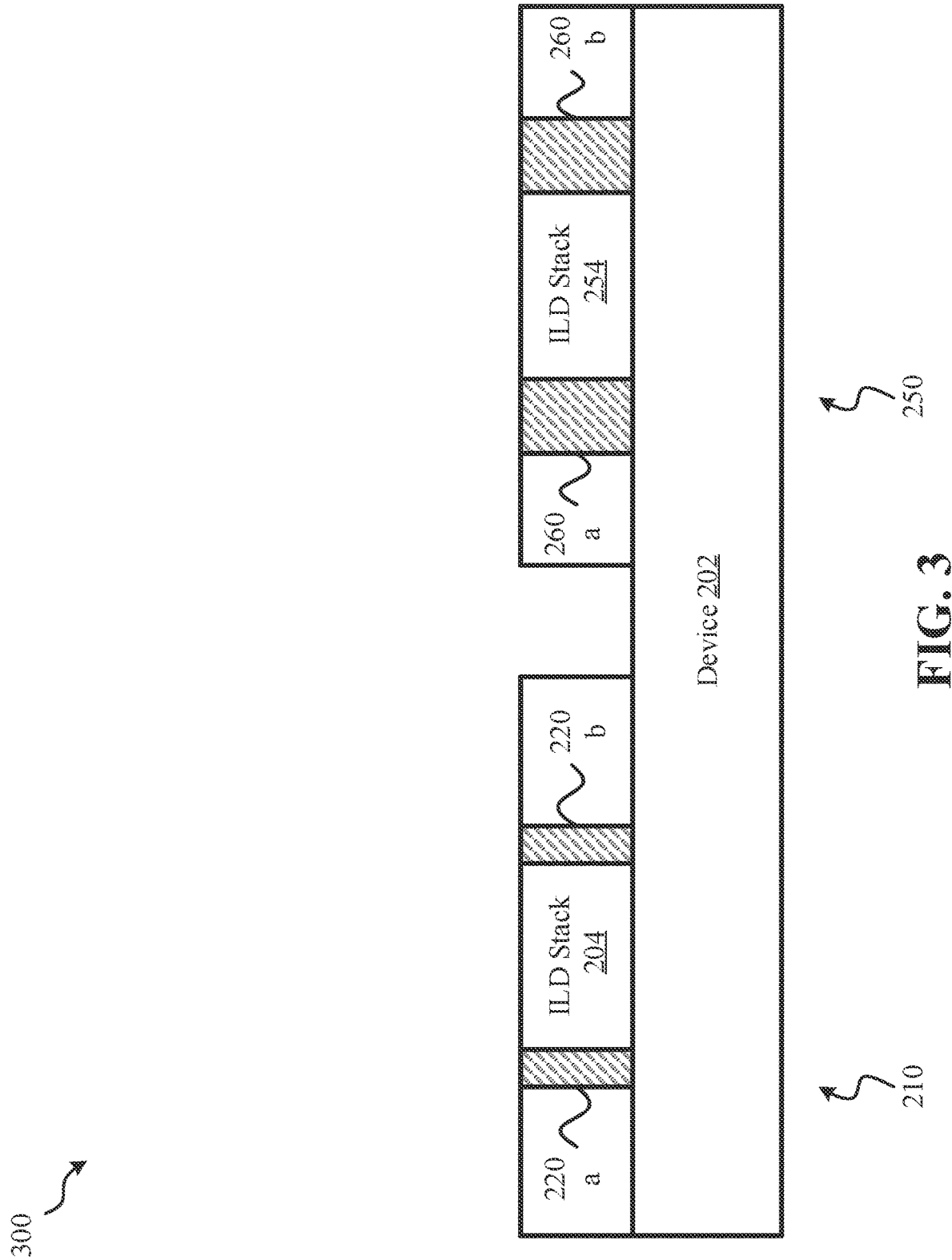
FIG. 3 depicts a schematic diagram of a second intermediate step of forming a first exemplary integrated circuit with both a PCM and MRAM, according to some embodiments.

Referring to FIG. 3, a schematic diagram of a second intermediate step 300 of forming a first exemplary integrated circuit with both a PCM and MRAM is depicted, according to some embodiments. Intermediate step 300 may be an intermediate step in forming integrated circuit 1100 (FIG. 11), in some instances. Once the ILD stacks 204 and 254 are formed, bottom electrodes 220a, 220b, 260a, and 260b may be formed within the ILD stacks 204 and 254, in order to connect device 202 with the remaining components of the integrated circuit (for instance, as depicted in FIGS. 4-11). Bottom electrodes 220a and 220b may be referred to collectively as bottom electrodes 220 and bottom electrodes 260a and 260b may be referred to collectively as bottom electrodes 260.

In some embodiments, intermediate step 300 includes etching an opening, or via, in ILD stack 204 and 254 and then performing a metallization process to deposit the bottom electrode material in each opening. The bottom electrodes 260 in MRAM region 250 may have a greater width than the bottom electrodes 220 in PCM region 210, in some instances. In some embodiments, the bottom electrodes 220 and 260 are made of a metal material, or materials, such as copper, tungsten, titanium nitride (TiN), etc.

Figure 4:
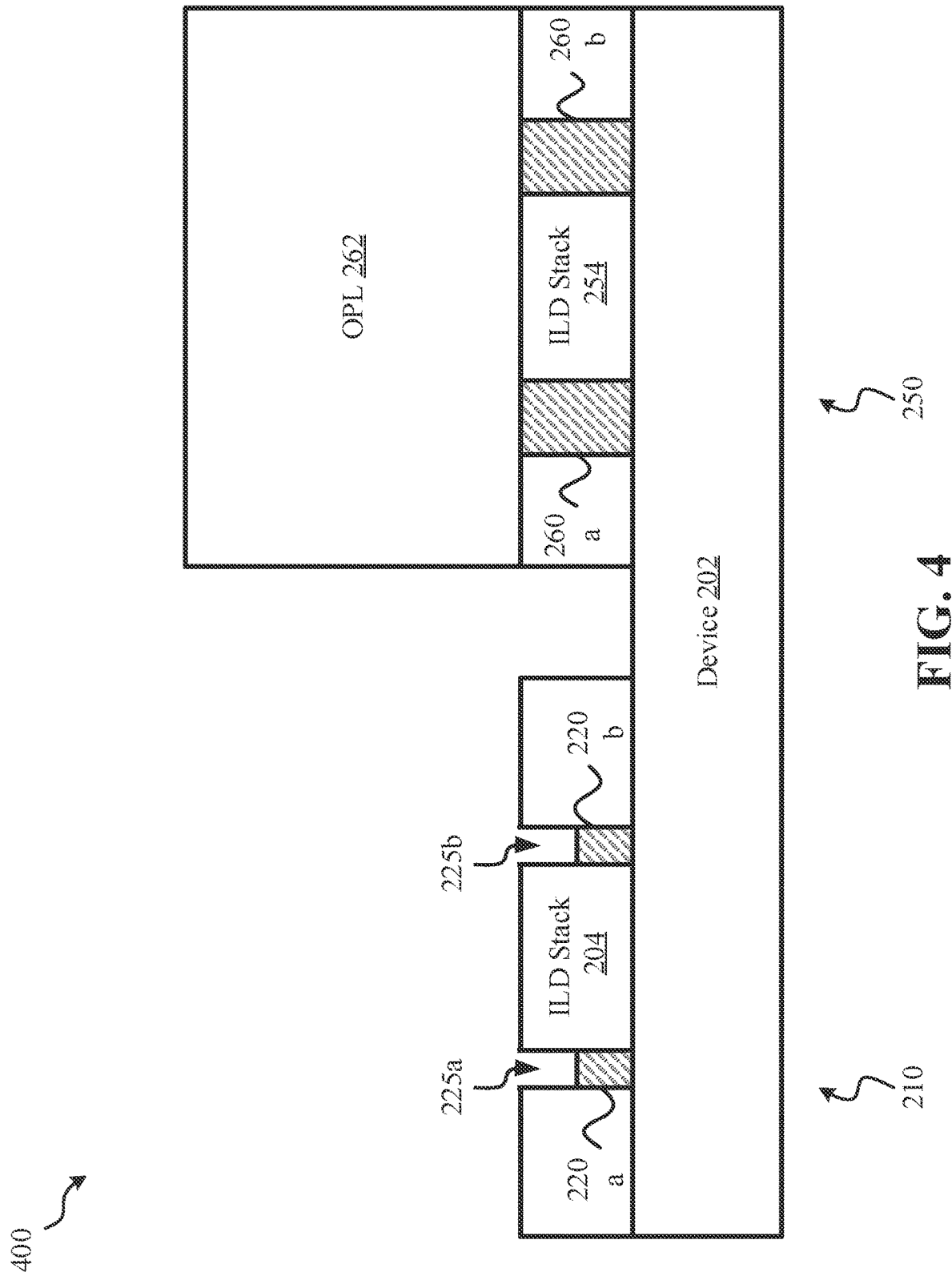
FIG. 4 depicts a schematic diagram of a third intermediate step of forming a first exemplary integrated circuit with both a PCM and MRAM, according to some embodiments.

Referring to FIG. 4, a schematic diagram of a third intermediate step 400 of forming a first exemplary integrated circuit with both a PCM and MRAM is depicted, according to some embodiments. Intermediate step 400 may be an intermediate step in forming integrated circuit 1100 (FIG. 11), in some instances. Intermediate step 400 may first include masking the bottom electrodes 260 and the MRAM region 250 to protect the bottom electrodes 260 on the MRAM region 250 from being recessed. In some embodiments, as depicted in FIG. 4, the masking material may be an organic planarization layer (OPL) 262, however any appropriate masking material may be used. Once MRAM region 250 and bottom electrodes 260 are protected (through the masking material) from any recession, intermediate step 400 may proceed to recessing the bottom electrodes. Because the bottom electrodes 260 are masked, bottom electrodes 220 are the only bottom electrodes that are recessed. In some embodiments, bottom electrodes 220 may be recessed using reactive-ion etching (RIE) and/or any other etching process. By masking the MRAM region 250 and only recessing the bottom electrodes 220, the PCM region 210 (and the resulting PCM) will have bottom electrodes 220 with a lower height compared to the bottom electrodes 260 in the MRAM region 250. Put more simply, bottom electrodes 220 are shorter than bottom electrodes 260. This will help protect the bottom electrodes 220 in later intermediate steps (discussed further herein).

Figure 5:
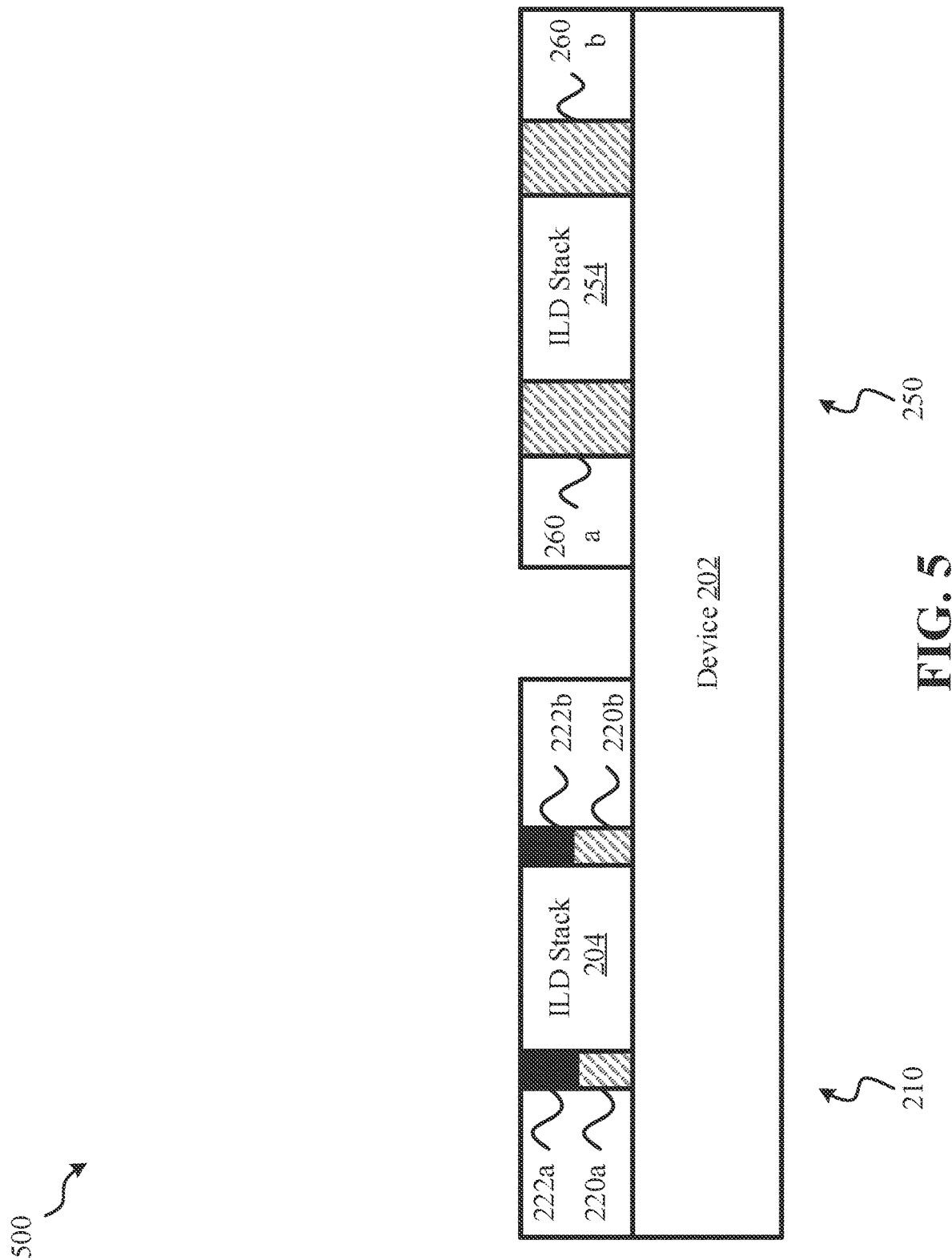
FIG. 5 depicts a schematic diagram of a fourth intermediate step of forming a first exemplary integrated circuit with both a PCM and MRAM, according to some embodiments.

Referring to FIG. 5, a schematic diagram of a fourth intermediate step 500 of forming a first exemplary integrated circuit with both a PCM and MRAM is depicted, according to some embodiments. Intermediate step 500 may be an intermediate step in forming integrated circuit 1100 (FIG. 11), in some instances. Intermediate step 500 includes forming a dielectric cap (222a and 222b) on top of the bottom electrodes 220. Dielectric caps 222a and 222b may be referred to collectively as dielectric caps 222. To form the dielectric caps 222, a dielectric material may be deposited on top of the bottom electrodes 220 to fill the openings created by recessing bottom electrodes 220 in intermediate step 400. In some instances, the dielectric caps 222 may be made up of silicon nitride (SiN), silicon dioxide ($SiO_2$), or any other dielectric material.

Intermediate step 500 may also include removing the OPL 262. As the etching of the bottom electrodes 220 was completed in intermediate step 400, OPL 262 may no longer be needed to mask the bottom electrodes 260 in the MRAM portion 250 and may be removed so that a top portion of bottom electrodes 260 may be exposed. Forming the dielectric caps 222 and removing the OPL 262 may not need to be performed at a same time, however both operations may occur as part of intermediate step 500. Put more simply, removing the OPL 262 and forming the dielectric caps 222 will both occur between FIG. 4 and FIG. 6.

Figure 6:
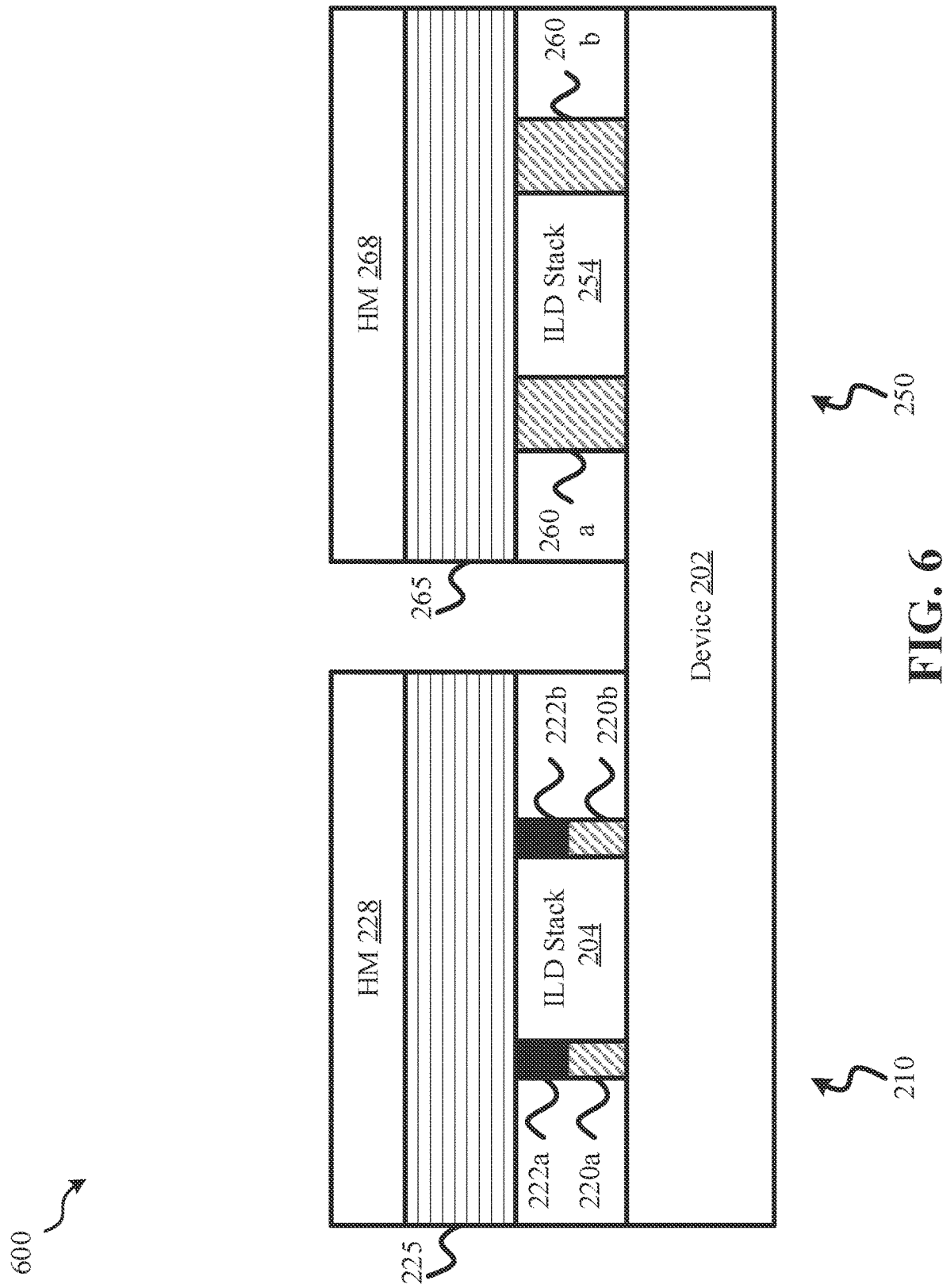
FIG. 6 depicts a schematic diagram of a fifth intermediate step of forming a first exemplary integrated circuit with both a PCM and MRAM, according to some embodiments.

Referring now to FIG. 6, a schematic diagram of a fifth intermediate step 600 of forming a first exemplary integrated circuit with both a PCM and MRAM is depicted, according to some embodiments. Intermediate step 600 may be an intermediate step in forming integrated circuit 1100 (FIG. 11), in some instances. Intermediate step 600 includes depositing MRAM stack 225 and 265 as well as hard masks (HMs) 228 and 268. As discussed herein, MRAMs include a permanent magnet plate (referred to herein as a fixed plate) and a plate with changeable magnetization (referred to herein as a free plate) as well as an insulator layer separating each free plate and fixed plate. These plates and insulators may be layered to form MRAM stacks 225 and 265. Put differently, each MRAM stack 225 and 265 comprises layers of free plates, fixed plates, and insulator layers separating the two. For example, an MRAM stack may include a free plate, insulator layer, fixed plate, insulator layer, free plate, insulator layer, fixed plate, insulator layer, etc. Although MRAM stacks are typically only part of an MRAM, an MRAM stack (225 and 265) is deposited on both the PCM region 210 and the MRAM region 250 in intermediate step 600, as PCM region 210 and MRAM region 250 are part of the same integrated circuit, in some instances.

Once the MRAM stacks 225 and 265 are deposited on PCM region 210 and MRAM region 250, respectively, intermediate step 600 may also include depositing a hard mask (HM) 228 and 268 on each region (210 and 250). Hard masks may be used to protect materials from the etching process. The benefits of the HMs are further discussed herein. In some embodiments, the HMs 228 and 268 may include silicon (Si).

Figure 7:
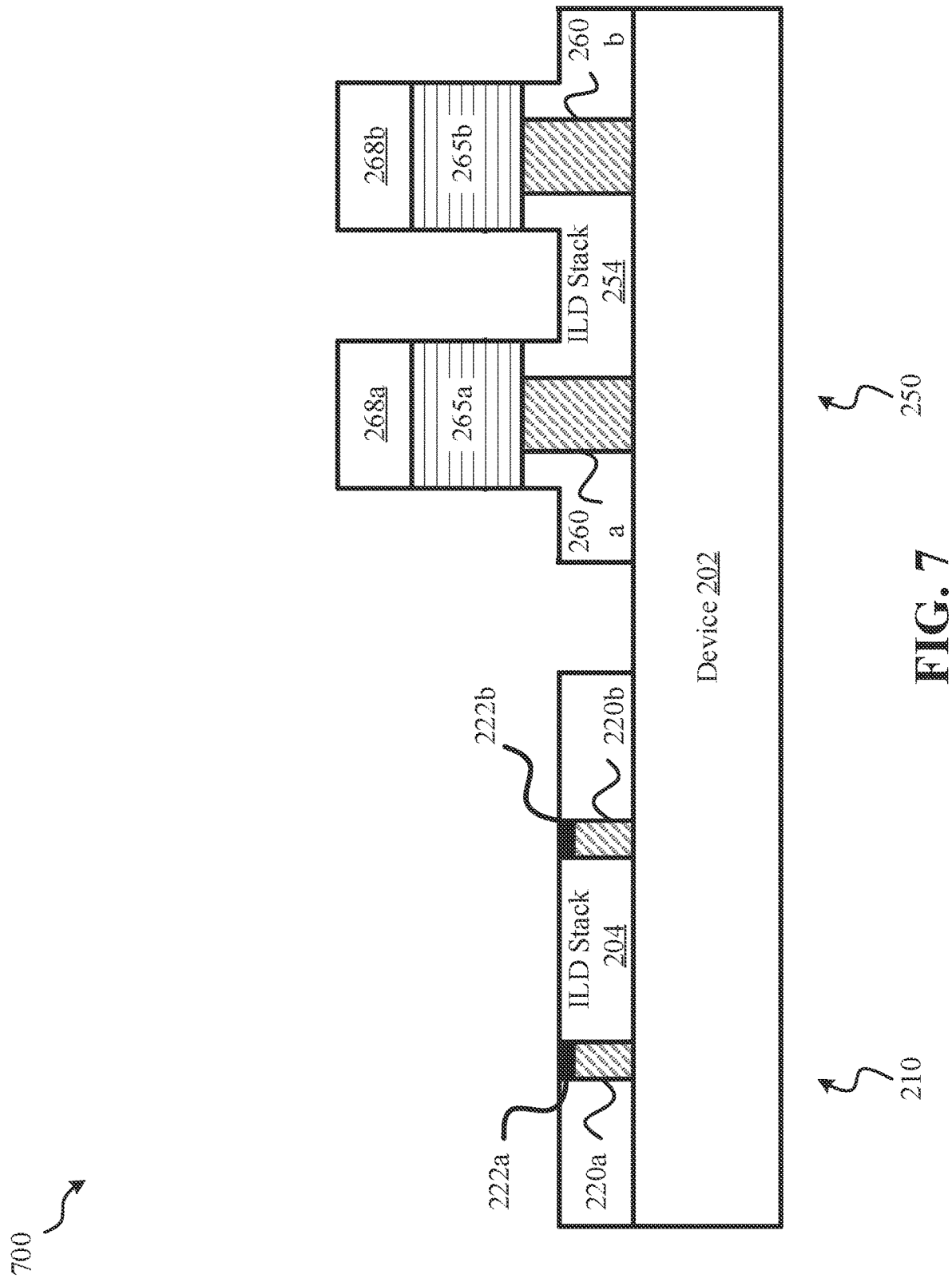
FIG. 7 depicts a schematic diagram of a sixth intermediate step of forming a first exemplary integrated circuit with both a PCM and MRAM, according to some embodiments.

Referring to FIG. 7, a schematic diagram of a sixth intermediate step 700 of forming a first exemplary integrated circuit with both a PCM and MRAM is depicted, according to some embodiments. Intermediate step 700 may be an intermediate step in forming integrated circuit 1100 (FIG. 11), in some instances. Intermediate step 700 includes patterning the PCM region 210 and the MRAM region 250. In some embodiments, the patterning is done through etching such as an ion beam etch, as the ion beam etch is a high energy beam that is strong enough to etch through the HM 268 and the MRAM stack 265. For instance, the ion beam etch (or other form of etching) may etch across the PCM region 210 and may etch the MRAM region 250 so that only MRAM stacks 265a and 265b as well as HM 268a and 268b remain from the earlier deposited MRAM stack 265 and HM 268. Further, both ILD stack 204 and ILD stack 254 may be slightly recessed through the patterning.

In some instances, if the bottom electrode 220 and/or 260 were etched by the ion beam etch, it may cause back sputtering and little shards of metal could fly into either the PCM region 210 and/or the MRAM region 250. This could cause damage to either the PCM region 210 and/or the MRAM region 250. In some instances, the MRAM region 250 may be killed/destroyed from back sputtering, as the metal could lodge into the MRAM stack 265a and/or MRAM stack 265b (which would ruin the functionality of the MRAM stack(s) 265a and/or 265b). Therefore, to prevent back sputtering (especially from the PCM region 210, the dielectric caps 222 were deposited in intermediate step 500. Specifically, intermediate step 400 recessed bottom electrodes 220, resulting in bottom electrodes 220 having a lower height than bottom electrodes 260. This height may need to be low enough so that it is lower than the etching that occurs in intermediate step 700. Intermediate step 500 then deposited dielectric caps 222 on top of bottom electrodes 220. These dielectric caps may protect the recessed bottom electrodes 220 from the etching and the ion beam etch during intermediate step 700. This way, the ion beam etch may only come into contact with the ILD stack 204 and the dielectric caps 222 (in the PCM region 210 portion of the integrated circuit) and no back sputtering may occur.

In the MRAM region 250 of the integrated circuit, the ion beam etch may etch around the bottom electrodes 260 and may not come into contact with them. This may help prevent any damage to the bottom electrodes 260 as well as any back sputtering from the bottom electrodes 260. The ion beam etch may come into contact with a small amount of metal from the MRAM stacks 265a and 265b, however as the MRAM stacks 265a and 265b include layers of free plates, fixed plates, and insulator layers, the ion beam etch may come into contact with much smaller amounts of metal than the bottom electrodes 260 and any back sputtering from these smaller amounts of metal may not be enough to cause damage in the PCM region 210 and/or the MRAM region 250.

Figure 8:
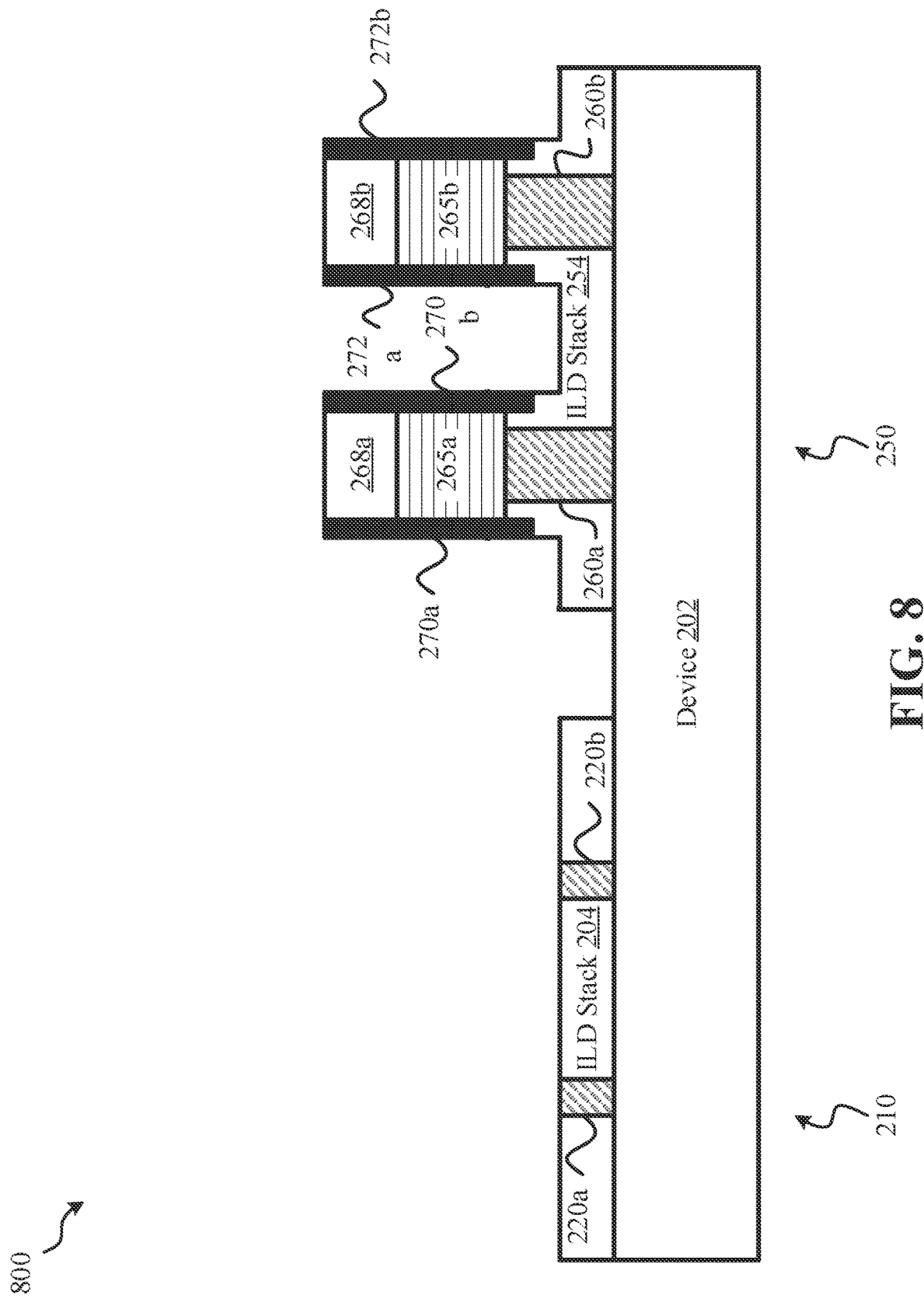
FIG. 8 depicts a schematic diagram of a seventh intermediate step of forming a first exemplary integrated circuit with both a PCM and MRAM, according to some embodiments.

Referring now to FIG. 8, a schematic diagram of a seventh intermediate step 800 of forming a first exemplary integrated circuit with both a PCM and MRAM is depicted, according to some embodiments. Intermediate step 800 may be an intermediate step in forming integrated circuit 1100 (FIG. 11), in some instances. Intermediate step 800 may first include depositing a dielectric spacer over both the PCM region 210 and the MRAM region 250. This dielectric spacer may eventually become dielectric spacers 270a, 270b, 272a and 272b (discussed further below) and may be used to protect the sidewalls of the MRAM stacks 265, for instance from subsequent processes. For example, the spacers may protect the MRAM region 250 and the MRAM stacks 265 from future etching, exposure to heat from external components, etc. The excess portions of the deposited spacer (i.e., any portions of the spacer that are not spacers 270a, 270b, 272a, and 272b) may be removed. This may remove all horizontal portions of the deposited spacer and may leave only spacers 270a, 270b, 272a, and 272b (referred to collectively as spacers 270 and 272, respectively). In some embodiments, the excess spacer may be removed through anisotropic spacer RIE.

Once the excess spacer is removed, the ILD stacks 204 and 254 may be recessed and the dielectric caps 222 may be removed. The bottom electrodes 220 may no longer need to be protected from ion beam etching, therefore the dielectric caps 222 may no longer be needed and may be removed. In some instances, ILD stack 204 may be recessed to be at a uniform level with the bottom electrodes 220. Further, portions of ILD stack 254 (i.e., the portions that are not supporting MRAM stacks 265 and HMs 268) may also be recessed to the same level as ILD stack 204. In some instances, the recessing of ILD stacks 204 and 254 and the removal of dielectric caps 222 may be performed using reactive ion etching (RIE). In some instances, the dielectric caps 222 may be etched away through over-etching.

Figure 9:
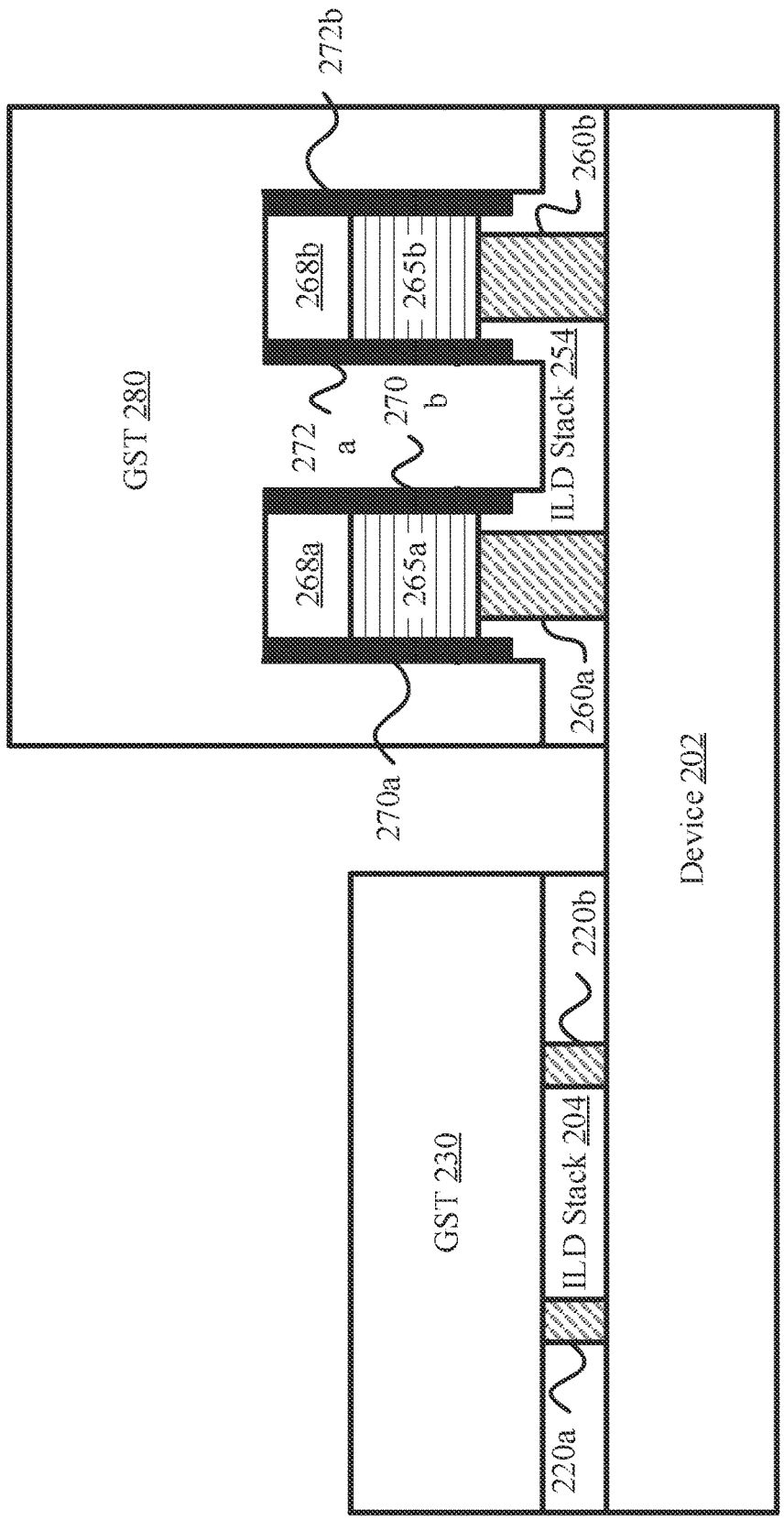
FIG. 9 depicts a schematic diagram of a eighth intermediate step of forming a first exemplary integrated circuit with both a PCM and MRAM, according to some embodiments.

Referring to FIG. 9, a schematic diagram of a eighth intermediate step 900 of forming a first exemplary integrated circuit with both a PCM and MRAM is depicted, according to some embodiments. Intermediate step 900 may be an intermediate step in forming integrated circuit 1100 (FIG. 11), in some instances. Intermediate step 900 may include depositing GST 230 and 280. GST is germanium-antimony-tellurium (or $Ge_2Sb_2Te_5$, referred to herein as GST), and it is an example phase change material used in PCMs. GST can change from a crystalline phase to an amorphous phase, and vice versa, which is crucial in a PCM in order to store data. Although GST 230 and 280 is depicted in FIG. 9, any other phase change material such as $GeTe/Sb_2Te_3$, or other alternative materials may be used here.

Although the GST 230 and 280 is only used in PCMs (therefore it will only be needed in PCM region 210 of the integrated circuit), GST (230 and 280) can be deposited on both the PCM region 210 and the MRAM region 250 of the integrated circuit, as PCM 210 and MRAM 250 are part of the same integrated circuit. This may be beneficial in use cases in which it is not feasible to deposit phase change material in only the PCM region 210.

Figure 10:
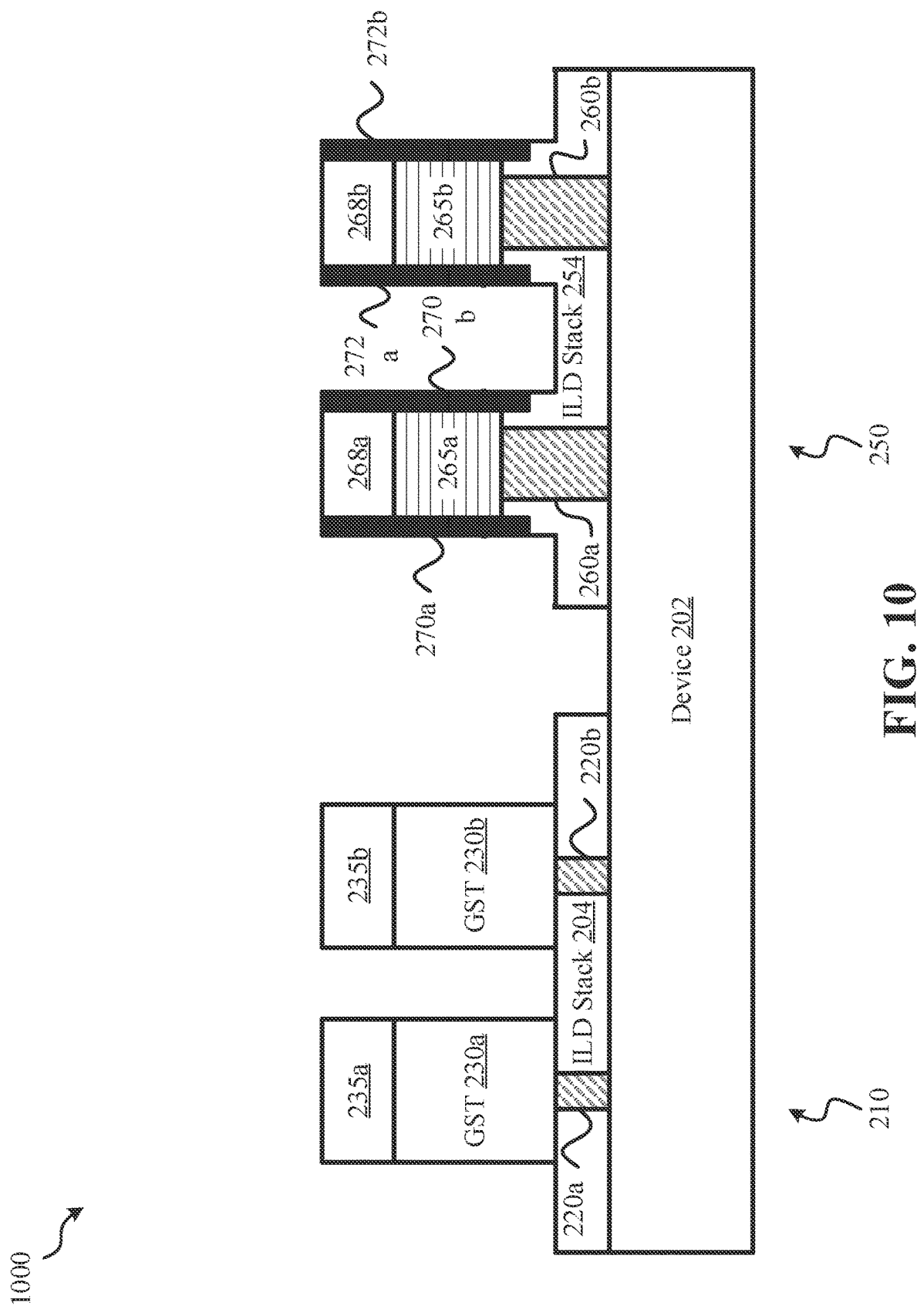
FIG. 10 depicts a schematic diagram of a ninth intermediate step of forming a first exemplary integrated circuit with both a PCM and MRAM, according to some embodiments.

Referring to FIG. 10, a schematic diagram of a ninth intermediate step 1000 of forming a first exemplary integrated circuit with both a PCM and MRAM is depicted, according to some embodiments. Intermediate step 1000 may be an intermediate step in forming integrated circuit 1100 (FIG. 11), in some instances. Intermediate step 1000 may include completely removing GST 280 from the MRAM region 250 of the integrated circuit as well as patterning the GST 230 on the PCM region 210 of the integrated circuit. As discussed above, GST may be used in PCM but may not be used in MRAM. Therefore, GST 280 is not needed in the MRAM portion 250 of the integrated circuit. To remove the GST 280, the GST 280 may be patterned and/or etched away. For example, a RIE may be used to remove the GST 280. The spacers 270 and 272 may protect the MRAM stacks 265 from any etching. In addition, GST 230 may be patterned and/or etched (for example, again through a RIE) to remove portions of GST 230 so that only GST 230a and 230b (portions of GST over the bottom electrodes 220) remain.

Intermediate step 1000 may also include depositing a hard mask (HM) 235a and 235b over GST 230a and 230b. HM 235a and 235b (referred to collectively as HM 235) may be similar and/or the same as HM 268, in some instances. In some embodiments, HM 235a and 235b may be deposited over GST 230a and 230b after GST 230a and 230b have been etched. In some embodiments, HM 235 may be deposited in a single layer over GST 230 (as it is depicted in FIG. 9) and may then be patterned and/or etched while the GST 230 is also being etched/patterned (for example, similar to intermediate operation 700 (FIG. 7) with HM 268).

Figure 11:
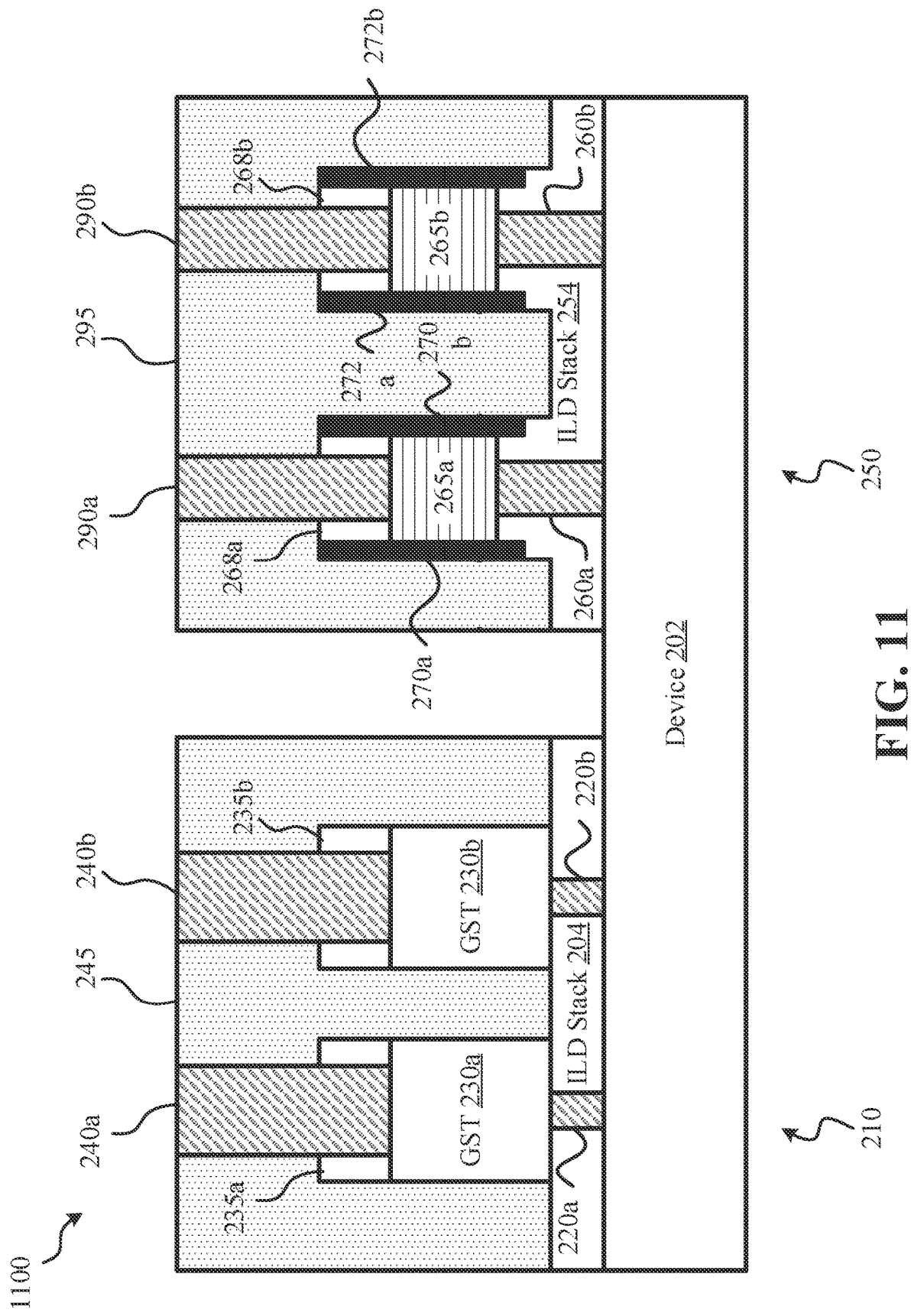
FIG. 11 depicts a schematic diagram of a formed first exemplary integrated circuit with both a PCM and MRAM, according to some embodiments.

Referring to FIG. 11, a schematic diagram of a formed integrated circuit 1100 with both a PCM and MRAM is depicted, according to some embodiments. To finish forming integrated circuit 1100, top electrodes may be formed for each bottom electrode. For instance, top electrode 240a may correspond to bottom electrode 220a, top electrode 240b may correspond to bottom electrode 220b, top electrode 290a may correspond to bottom electrode 260a, and top electrode 290b may correspond to bottom electrode 260b. In some instances, current may be transferred between each bottom electrode (220a, 220b, 260a, and 260b) and their corresponding top electrode (240a, 240b, 290a, and 290b) and may generate heat.

In the PCM portion 210 of the integrated circuit 1100, the current transferred between the bottom electrodes 220 and the top electrodes 240 may generate heat and may change the phase of the GST(s) 230, which is how data is stored in the PCM and how the PCM operates.

In the MRAM portion 250 of the integrated circuit 1100, the current transferred between the bottom electrodes 260 and the top electrodes 290 travels through the MRAM stacks 265. As discussed herein, each MRAM stack includes layers of free plates (plates with changeable magnetization) and fixed plates (plates with a permanent magnet), each layer separated by a thin insulator layer. The current travelling through the MRAM stacks 265 forms electron tunneling between the free plates and fixed plates, and the direction of the free plate can be altered to change the amount of electron tunneling and current transfer between bottom electrodes 260 and top electrodes 290. Data may be stored in the MRAM 250 (and the MRAM 250 may operate) through the changing amounts of electron tunneling and current transfer (discussed further above).

To fully form integrated circuit 1100, dielectric 245 and 295 may be deposited for the PCM 210 and MRAM 250, respectively. In some embodiments, dielectric 245 and 295 are formed, and then, after the dielectric 245 and 295 are formed, the top electrodes 240 are formed through patterning and metallization. In some embodiments, dielectric 245 and 295 are interlayer dielectric (ILD). Dielectric 245 and 295 may act as an electric insulator to prevent current and heat from top electrodes 240 and 290 from transferring to any other components of integrated circuit 1100 and/or other areas (not depicted) of the AI accelerator.

Integrated circuit 1100 may give a cross-sectional view of an integrated circuit with both a PCM 210 and an MRAM 250 within the same integrated circuit 1100 (and at a same level within the integrated circuit 1100). In some embodiments, integrated circuit 1100 corresponds to integrated circuit 160 (FIG. 1), PCM 210 corresponds to PCM 120 (FIG. 1), and MRAM 250 corresponds to MRAM 130 (FIG. 1). Having PCM 210 and MRAM 250 within the same level and within the same integrated circuit may allow both PCM 210 and MRAM 250 to have a close proximity to any computation units (such as logic module 150 (FIG. 1)) within an AI accelerator (such as AI accelerator 100 (FIG. 1)).

Although integrated circuit 1100 depicts a PCM 210 with two bottom electrodes 220, two GSTs 230, two HMs 235, and two top electrodes 240, any number of bottom electrodes 220, GSTs 230, HMs 235, and top electrodes 240 may be included in PCM 210. Similarly, although MRAM 250 is depicted as having two bottom electrodes 260, two MRAM stacks 265, two HMs 268, and two top electrodes 290, MRAM 250 may include any number of bottom electrodes 260, MRAM stacks 265, HMs 268, and top electrodes 290.

Figure 12:
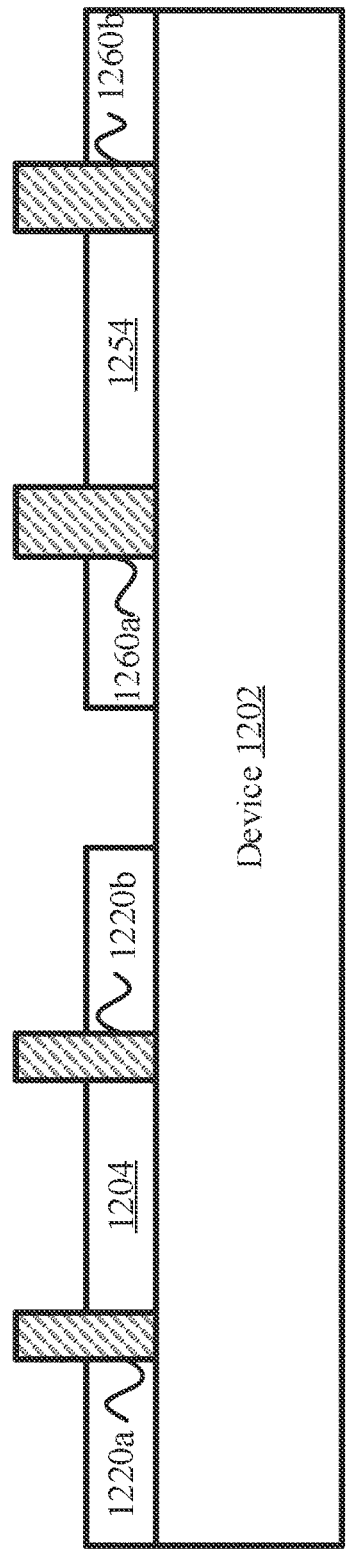
FIG. 12 depicts a schematic diagram of an intermediate step of forming a second exemplary integrated circuit with both a PCM and MRAM, according to some embodiments.

Referring now to FIG. 12, an intermediate step 1200 of forming a second exemplary integrated circuit with both PCM and MRAM is depicted, according to some embodiments. Intermediate steps 1200 and 1300 (FIG. 13) may be alternative methods of forming an integrated circuit, and integrated circuit 1500 (FIG. 15) may be an alternative embodiment of an integrated circuit with a PCM and MRAM at a same level within the integrated circuit. Intermediate step 1200 may be an intermediate step in forming integrated circuit 1500, in some instances. In some embodiments, the first and second intermediate steps in forming integrated circuit 1500 may be the same as first intermediate step 200 (FIG. 2) and second intermediate step 300 (FIG. 3), and third intermediate step 1200 may follow second intermediate step 300.

In intermediate step 1200, once the ILD stacks 1204 and 1254 are deposited on top of device 1202 (in a same/similar method to intermediate operation 200 (FIG. 2)) and bottom electrodes 1220a, 1220b, 1260a, and 1260b are formed (in a same/similar method to intermediate operation 300 (FIG. 3)), the ILD stacks 1204 and 1254 may be recessed. This may remove the need for some of the masking operations such as OPL 262 (FIG. 4) which may help reduce expenses and materials for forming the integrated circuit. In some embodiments, the ILD stacks 1204 and 1254 may be reduced via etching (such as RIE).

Figure 13:
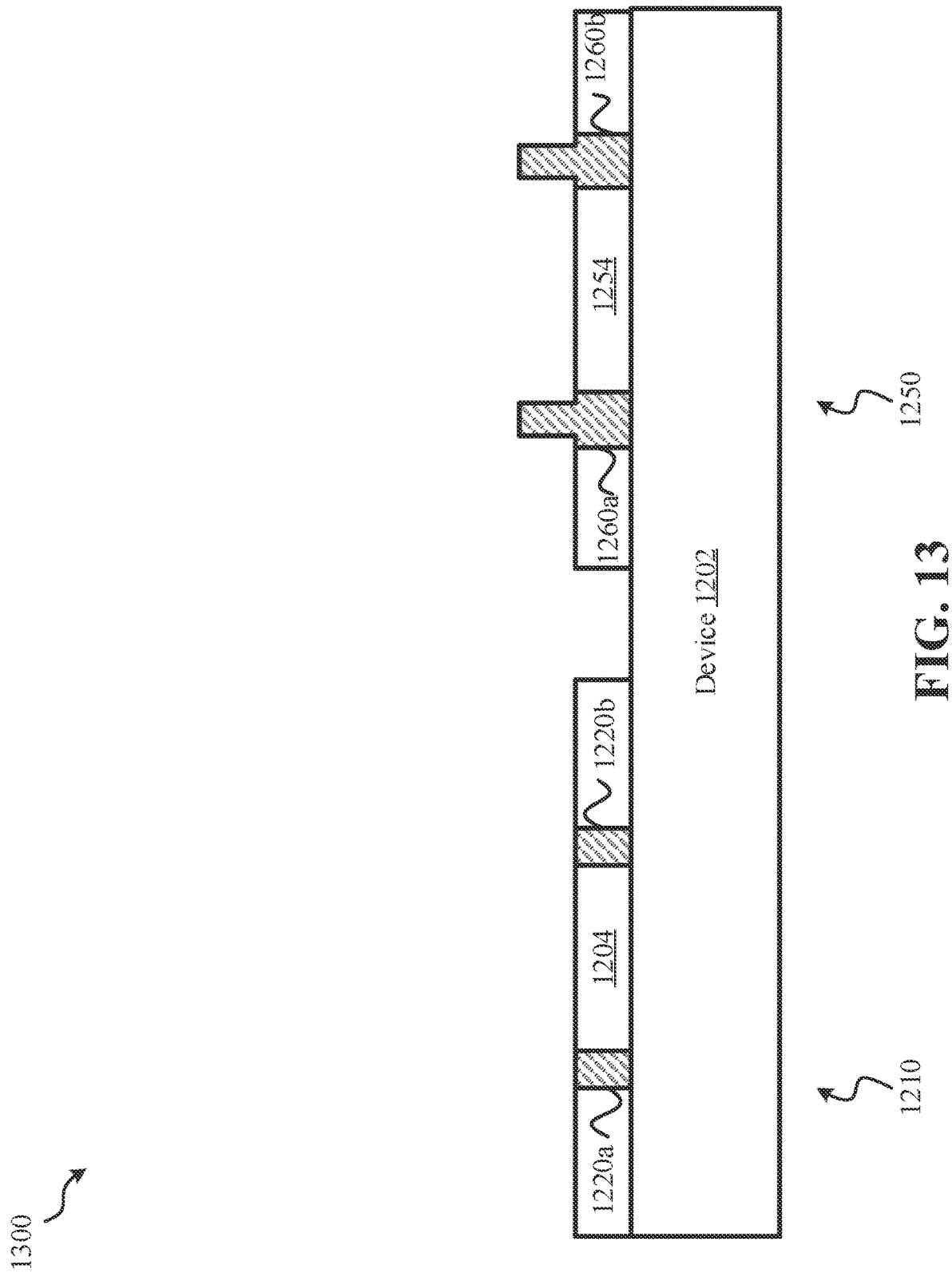
FIG. 13 depicts a schematic diagram of another intermediate step of forming a second exemplary integrated circuit with both a PCM and MRAM, according to some embodiments.

Referring to FIG. 13, an intermediate step 1300 of forming a second exemplary integrated circuit with both PCM and MRAM is depicted, according to some embodiments. Intermediate step 1300 may be an intermediate step in forming integrated circuit 1500, in some instances. Intermediate step 1300 may include removing portions of the bottom electrodes 1220 and 1260. Bottom electrodes 1220 may be etched so that they are in line with the ILD stack 1204. However, in the MRAM portion 1250 of the integrated circuit, some of the bottom electrodes 1260 may need to remain exposed above the ILD stack 1254. Therefore, bottom electrodes 1260 may be etched such that the portions of bottom electrode 1260 that are above the ILD stack 1254 are smaller in width than the portions of the bottom electrode 1260 that are not exposed. In some embodiments, the etching of bottom electrodes 1220 and 1250 may be executed using isotropic etching.

By recessing the bottom electrodes 1220 and 1250 prior to any deposition of MRAM stack (such as MRAM stack 1265 (FIG. 15)), there may be minimal to no risk of back sputtering causing any damage to the PCM 1210 and/or MRAM 1250. The main risk for damage caused by back sputtering in the previous embodiments (such as FIG. 7) was if the bottom electrodes were etched after the MRAM stacks were deposited, metal from the bottom electrodes may fly and hit the MRAM stacks, causing damage and likely ruining any operability of the MRAM stacks. However, in intermediate operation 1300, the etching done to the bottom electrodes 1220 and 1260 occurs prior to any deposition of the MRAM stacks, therefore there are no MRAM stacks to damage through back sputtering. Any back sputtering caused by etching the bottom electrodes 1220 and 1260 may either hit the other bottom electrodes (1220 and/or 1260) or the ILD stacks 1204 and/or 1254, which may not cause any damage to the PCM 1210 and/or MRAM 1250.

Figure 14:
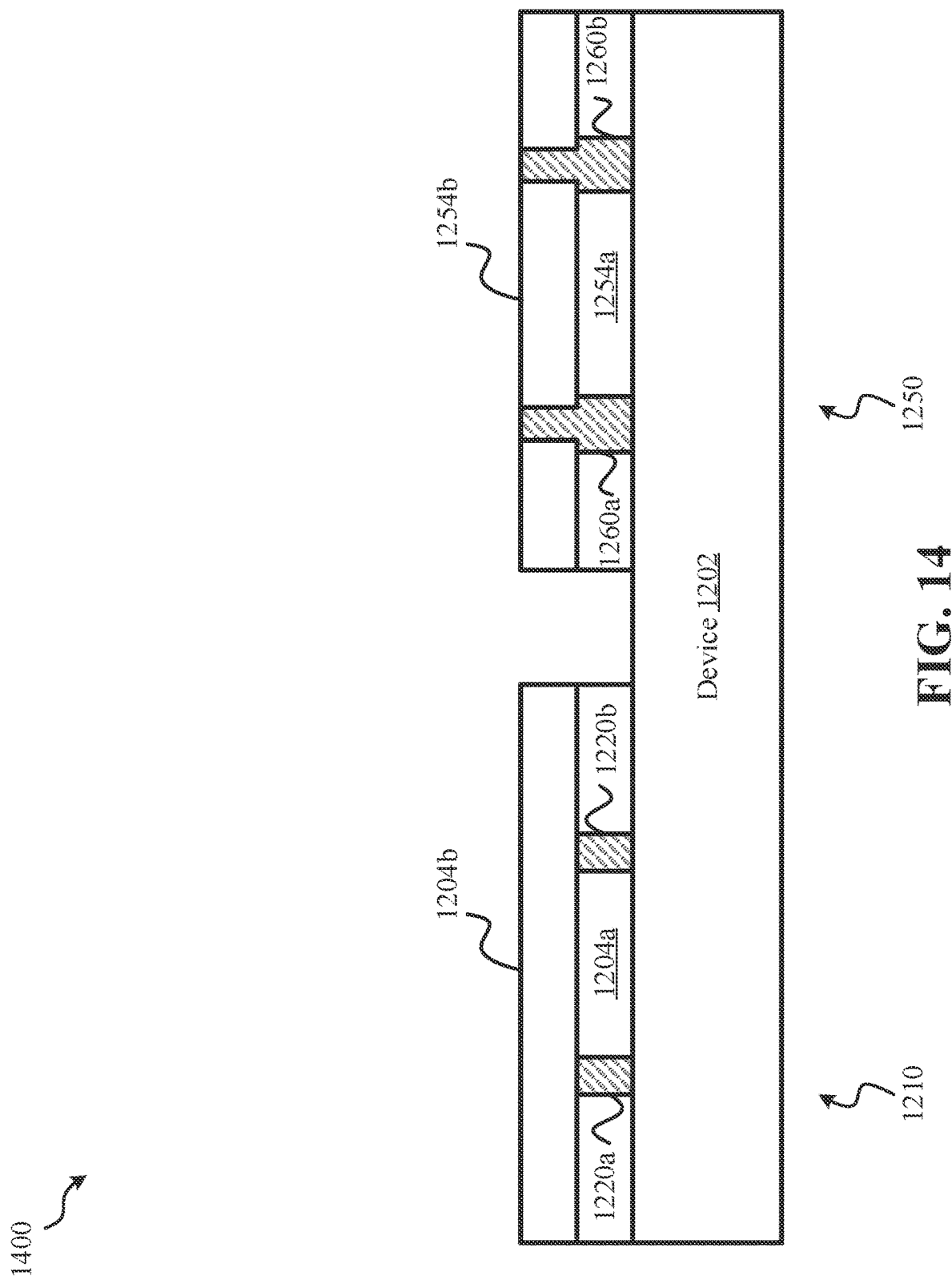
FIG. 14 depicts a schematic diagram of another intermediate step of forming a second exemplary integrated circuit with both a PCM and MRAM, according to some embodiments.

Referring to FIG. 14, another intermediate step of forming a second exemplary integrated circuit with both PCM and MRAM is depicted, according to some embodiments. Intermediate step 1400 may be an intermediate step in forming integrated circuit 1500, in some instances. Intermediate step 1400 may include depositing an additional layer of ILD stack on both the PCM region 1210 and the MRAM region 1250. This is depicted as ILD stack 1204b and ILD stack 1254b, respectively. In FIG. 14, the previously deposited portions of ILD stack (discussed in FIG. 12) are depicted as ILD stack 1204a and 1254a. FIG. 14 depicts ILD stack 1204a and 1204b as separate layers and ILD stack 1254a and 1254b as separate layers, however these stacks may be made of a same material and may merge together as a single ILD stack 1204 and a single ILD stack 1254. The layers are depicted separately in FIG. 14 to help demonstrate how the layers are deposited.

Once the bottom electrodes 1220 and 1260 have been recessed and etched and the additional portions of ILD stack 1204 and 1254 have been deposited, integrated circuit 1500 (FIG. 15) may finish forming using the same and/or similar methods discussed in intermediate steps 600-1000 (FIGS. 6-10). For instance, the ILD stacks 1204 and 1254 may be patterned and recessed (for example, through ion beam etch) similar to intermediate step 700 (FIG. 7). However, for integrated circuit 1500 (FIG. 15), the bottom electrode 1220 may not need to be capped (for instance, with a dielectric cap 222 (FIG. 7)) as the bottom electrode 1220 has already been recessed and may not be in danger of causing any back sputtering during the ion beam etch.

Figure 15:
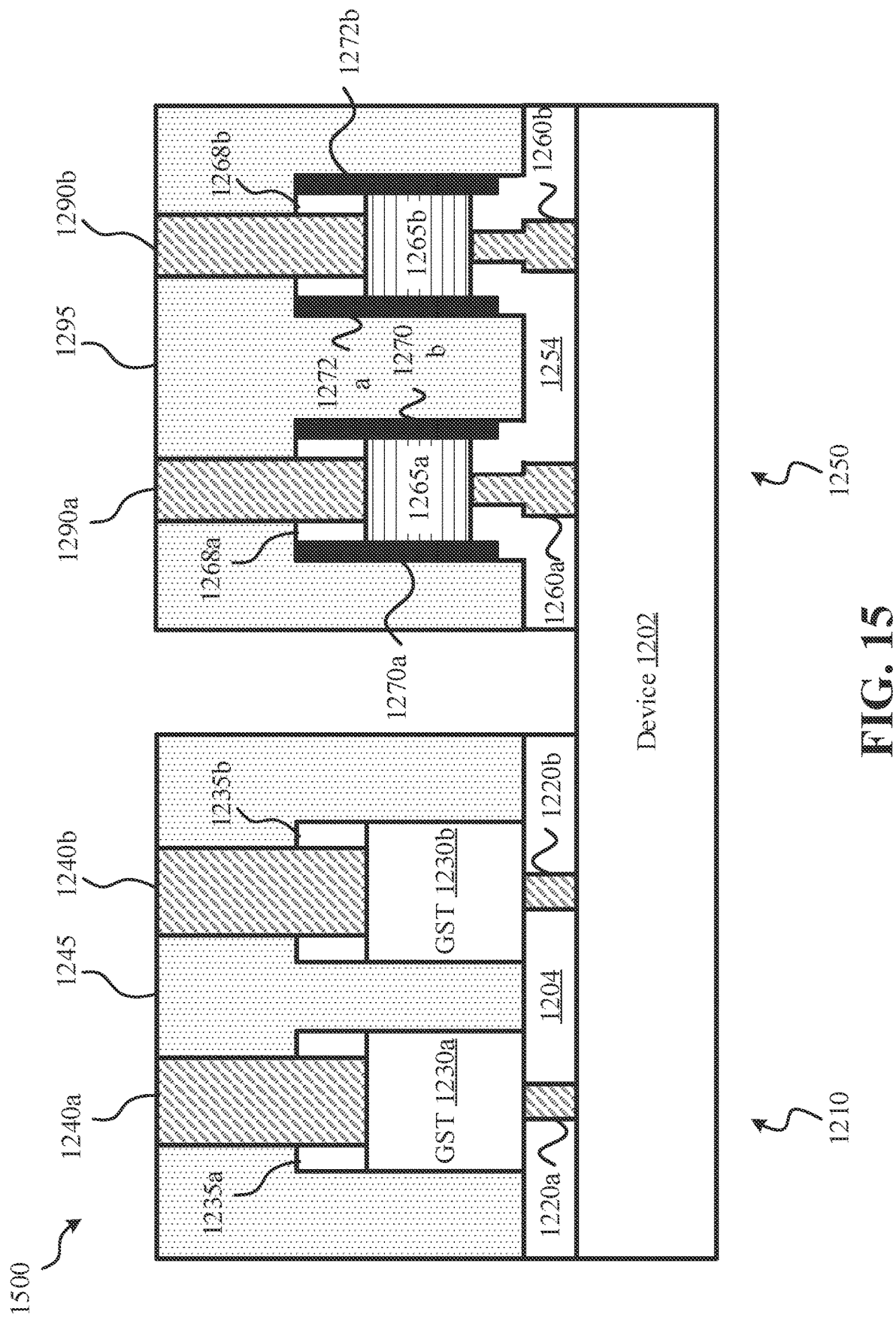
FIG. 15 depicts a schematic diagram of a formed second exemplary integrated circuit with both a PCM and MRAM, according to some embodiments.

Referring now to FIG. 15, a schematic diagram of a formed integrated circuit 1500 with both a PCM and MRAM is depicted, according to some embodiments. Similar to integrated circuit 1100 (FIG. 11), integrated circuit 1500 includes a PCM 1210 and an MRAM 1250 within the same integrated circuit 1500 (and at a same level within the integrated circuit 1500). The PCM portion 1210 of the integrated circuit 1500 includes ILD stack 1204, bottom electrodes 1220, GSTs 1230a and 1230b, HMs 1235a and 1235b, top electrodes 1240a and 1240b, and dielectric 1240. The MRAM portion 1250 of the integrated circuit 1500 includes ILD stack 1204, bottom electrodes 1260, MRAM stacks 1265a and 1265b, spacers 1270a, 1270b, 1272a, and 1272b, HMs 1268a and 1268b, top electrodes 1290a and 1290b, and dielectric 1295. The components of the integrated circuit 1500 may be similar and/or the same as the components of integrated circuit 1100 (FIG. 11) and may have similar/same functionalities.

Figure 16:
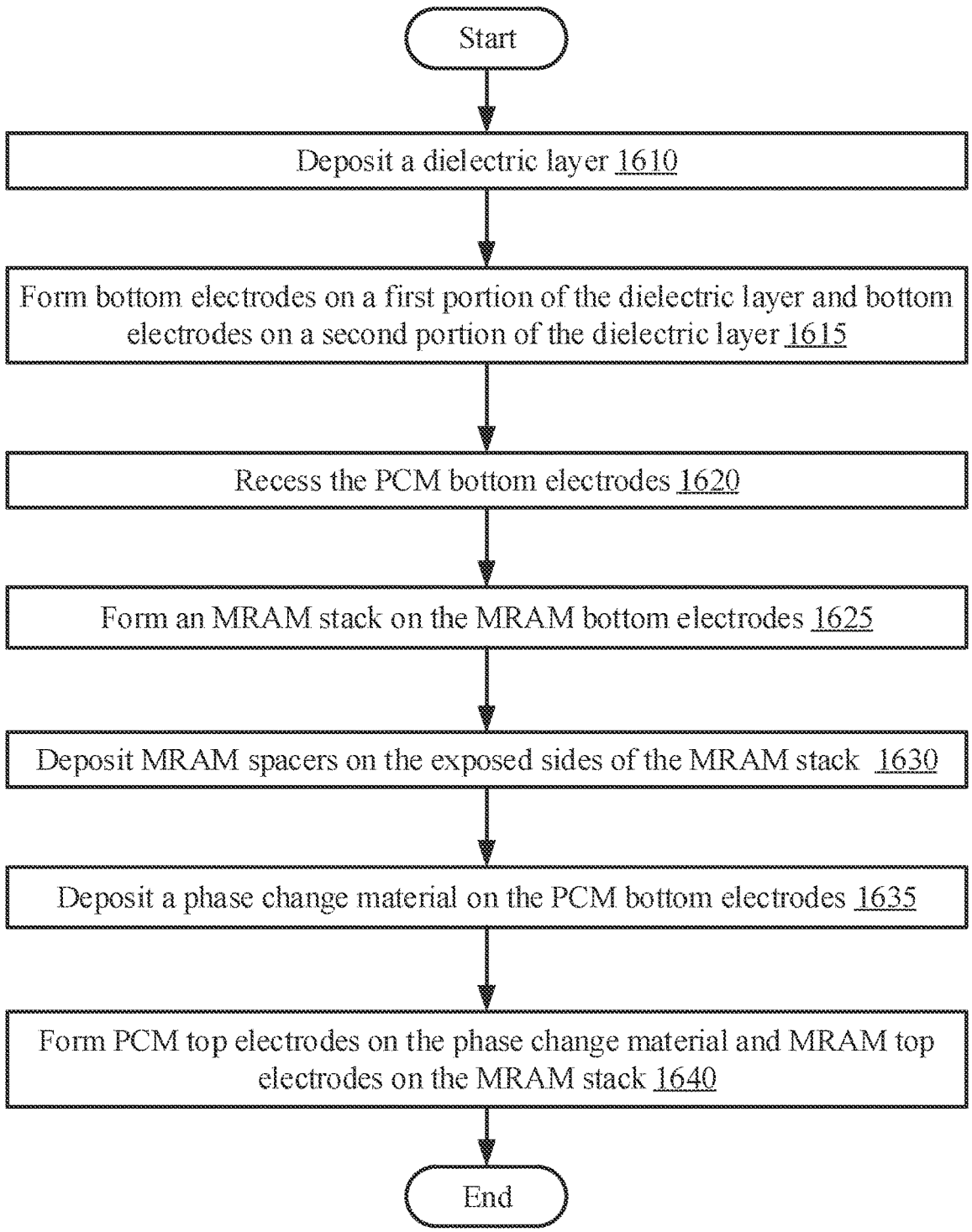
FIG. 16 depicts a flowchart of an exemplary method for forming an integrated circuit with both a PCM and MRAM, according to some embodiments.

Referring to FIG. 16, a method 1600 of forming an integrated circuit with both PCM and MRAM (such as integrated circuit 1100 (FIG. 11) or integrated circuit 1500 (FIG. 15)) is depicted, according to some embodiments. Although FIG. 16 depicts operations in an order, these operations may be executed in alternative orders and/or may be executed at a same/similar time.

Method 1600 includes operation 1610 to deposit a dielectric layer. In some embodiments, the dielectric layer may be an ILD stack. Operation 1610 may correspond to intermediate step 200 (FIG. 2), in some instances.

Method also 1600 includes operation 1615 to form one or more bottom electrodes in a first portion of the dielectric layer and bottom electrodes on a second portion of the dielectric layer. Forming one or more bottom electrodes may include patterning at least a first opening in the first portion of the dielectric layer and a second opening in the second portion of the dielectric layer. Each opening may then be filled with a metal through a metallization process, therefore forming a bottom electrode in each opening. The first portion of the dielectric layer may correspond with the PCM portion of the integrated circuit and the second portion of the dielectric layer may correspond with the MRAM portion of the integrated circuit. Each portion (PCM and MRAM) of the integrated circuit may include at least one bottom electrode. The bottom electrode(s) in the PCM region of the integrated circuit may be referred to as PCM bottom electrode(s) and the bottom electrode(s) in the MRAM region of the integrated circuit may be referred to as MRAM bottom electrode(s). In some embodiments, operation 1615 may correspond to intermediate step 300 (FIG. 3).

Method 1600 includes operation 1620 to recess the PCM bottom electrode(s). The recessed PCM bottom electrode(s) may have a lower height than the MRAM bottom electrode(s). This may help prevent any back sputtering from the PCM bottom electrode(s) when being etched. In some embodiments, the PCM bottom electrode(s) may be recessed similar to intermediate step 400 (FIG. 4), and a mask (such as OPL 262) may be put on the MRAM bottom electrode(s) in order to protect them from any etching/recessing. The mask may be removed after the PCM bottom electrode(s) have been recessed. In some instances, for example when forming integrated circuit 1100 (FIG. 11), the recessed PCM bottom electrode(s) may be capped with a dielectric. The dielectric cap may protect the recessed PCM bottom electrode from future etching and may prevent back sputtering.

In some embodiments, the PCM bottom electrode(s) may be recessed similar to intermediate step 1300 (FIG. 13). In these instances, the dielectric layer(s) (such as ILD layers 1204 and 1254 (FIG. 13)) may be recessed prior to any etching, and then both the PCM bottom electrode(s) and MRAM bottom electrode(s) may be recessed (for instance, contemporaneously).

Method 1600 includes operation 1625 to form an MRAM stack on the MRAM bottom electrodes. As discussed herein, an MRAM stack may include a plurality of layers of free plates and fixed plates, each plate separated by a thin insulator layer. In some instances, the MRAM stack may only be deposited on top of (e.g., proximately connected to) the MRAM bottom electrode(s). In some instances, as discussed in intermediate operation 600 (FIG. 6), the MRAM stack may be deposited on both the MRAM and PCM electrode(s), but may be later removed from the PCM electrode(s). In some instances, a hard mask is deposited on top of the MRAM stack (similar to operation 600 (FIG. 6)). The hard mask may be deposited on both the MRAM and PCM, in some instances. In some embodiments, forming the MRAM stack may include depositing and patterning the MRAM stack to form MRAM pillars on top of the MRAM bottom electrodes. The MRAM stack and MRAM hard mask may be removed off of the PCM portion of the integrated circuit, as discussed herein. This may be done while there is still a dielectric cap on top of the PCM bottom electrode(s), in some instances.

Method 1600 includes operation 1630 to deposit MRAM spacers on the exposed sides of the MRAM stack. The spacers may help protect the MRAM stack from damage and/or exposure. In some embodiments, the spacers may be deposited as discussed in intermediate step 800 (FIG. 8). In some instances, these spacers may be deposited very quickly after the MRAM stack has been deposited in order to protect the MRAM stack from subsequent processes.

Method 1600 includes operation 1635 to deposit a phase change material on the PCM bottom electrodes. In some instances, the phase change material (such as GST) may only be deposited on top of (e.g., proximately connected to) the PCM bottom electrode(s). In some instances, as discussed in intermediate operation 900 (FIG. 9), the phase change material may be deposited on both the PCM bottom electrode(s) and the MRAM portion of the integrated circuit, but may later be removed from the MRAM portion of the integrated circuit. In some embodiments, the phase change material may be deposited on both the PCM region and the MRAM region, and may subsequently be patterned on the PCM region and completely removed in the MRAM region. This may result in a trimmed phase change material on the PCM region and no phase change material on the MRAM region. In some embodiments, a hard mask is deposited on top of (i.e., proximately connected to) the phase change material. This may occur prior to the patterning and removal of portions of the phase change material. In these instances, the hard mask may be removed from the MRAM portion, along with the phase change material, and may be patterned along with the phase change material (on the PCM portion) to form PCM pillars.

Method 1600 includes operation 1640 to form top electrodes on the phase change material and on the MRAM stack. The top electrode(s) on top of the phase change material may be referred to as PCM top electrodes and the top electrodes on top of the MRAM stack may be referred to as MRAM top electrodes. The PCM top electrodes may be proximately connected to the phase change material and the MRAM top electrodes may be proximately connected to the MRAM stack.

The present invention may be a system, a method, etc. at any possible technical detail level of integration. The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit in a close proximity to a computation unit, the integrated circuit comprising:
a magnetoresistive random access memory (MRAM), wherein the MRAM comprises:
an MRAM bottom electrode with a first bottom surface in a first plane;
an MRAM stack; and
an MRAM top electrode; and
a phase change memory (PCM), wherein the PCM comprises:
a PCM bottom electrode, wherein the PCM bottom electrode has a second bottom surface in the first plane;
a phase change material; and
a PCM top electrode;
wherein the first plane is parallel to a substrate on which the MRAM and the PCM are formed, and wherein the MRAM bottom electrode extends away from the first plane farther than the PCM bottom electrode extends away from the first plane.

2. The integrated circuit of claim 1, wherein the MRAM stack comprises a plurality of layers of fixed plates and free plates, each plate separated by an insulator spacer.

3. The integrated circuit of claim 1, wherein the MRAM further comprises:
a plurality of spacers protecting exposed edges of the MRAM stack.

4. The integrated circuit of claim 1, further comprising:
a back end of line (BEOL) interconnect proximately connected to a top portion of the MRAM and the PCM; and
a middle of line (MOL) contact proximately connected to a bottom portion of the MRAM and the PCM.

5. The integrated circuit of claim 1, wherein:
the MRAM comprises a plurality of MRAM bottom electrodes, a plurality of MRAM stacks, and a plurality of MRAM top electrodes; and
the PCM comprises a plurality of PCM bottom electrodes, a plurality of phase change materials, and a plurality of PCM top electrodes.

6. A system comprising:
an integrated circuit, the integrated circuit comprising:
a magnetoresistive random access memory (MRAM), wherein the MRAM comprises:
an MRAM bottom electrode with a first bottom surface in a first plane; and
an MRAM stack; and
a phase change memory (PCM), wherein the PCM comprises:
a PCM bottom electrode, wherein the PCM bottom electrode has a second bottom surface in the first plane; and
a phase change material; and
a computation unit in a close proximity to the integrated circuit;
wherein the first plane is parallel to a substrate on which the MRAM and the PCM are formed, and wherein the MRAM bottom electrode extends away from the first plane farther than the PCM bottom electrode extends away from the first plane.

7. The system of claim 6, wherein the MRAM stack comprises a plurality of layers of fixed plates and free plates, each plate separated by an insulator spacer.

8. The system of claim 6, wherein the MRAM further comprises:
a plurality of spacers protecting exposed edges of the MRAM stack.

9. The system of claim 6, wherein:
the computation unit is proximately connected to the integrated circuit.

10. The system of claim 6, wherein the computation unit is a logic module.

11. The system of claim 6, wherein the integrated circuit and the computation unit are comprised within an artificial intelligence (AI) accelerator.

12. The system of claim 6, wherein:
the MRAM comprises a plurality of MRAM bottom electrodes and a plurality of MRAM stacks; and
the PCM comprises a plurality of PCM bottom electrodes and a plurality of phase change materials.

13. A method of forming the integrated circuit, the method comprising:
forming a first bottom electrode on a first plane in a first portion of a dielectric layer, resulting in a phase change memory (PCM) bottom electrode;
forming a second bottom electrode on the first plane in a second portion of the dielectric layer, resulting in a magnetoresistive random access memory (MRAM) bottom electrode, wherein the MRAM bottom electrode is formed to extend away from the first plane a same distance as the PCM bottom electrode extends away from the first plane;
recessing the PCM bottom electrode, wherein the recessed PCM bottom electrode extends away from the first plane a lesser distance than the MRAM bottom electrode than the PCM bottom electrode extends away from the first plane;
forming an MRAM stack proximately connected to the MRAM bottom electrode; and
depositing a phase change material proximately connected to the recessed PCM bottom electrode.

14. The method of claim 13, further comprising:
forming a dielectric cap on top of the recessed PCM bottom electrode;
forming the MRAM stack, wherein a first portion of the MRAM stack is proximately connected to the dielectric cap and a second portion of the MRAM stack is proximately connected to the MRAM bottom electrode;
patterning the first portion and the second portion of the MRAM stack; and
removing the dielectric cap.

15. The method of claim 14, wherein patterning the first portion and the second portion of the MRAM stack comprises:
removing the first portion of MRAM stack from the dielectric cap; and
recessing the second portion of the MRAM stack.

16. The method of claim 13, further comprising:
masking the MRAM bottom electrode prior to recessing the PCM bottom electrode, resulting in an MRAM mask; and
removing the MRAM mask after the PCM bottom electrode is recessed.

17. The method of claim 13, further comprising:
recessing the first portion of dielectric layer and the second portion of dielectric layer; and
recessing the MRAM bottom electrode prior to forming the MRAM stack.

18. The method of claim 17, wherein the recessing the MRAM bottom electrode is contemporaneous to the recessing the PCM bottom electrode.

19. The method of claim 13, wherein the PCM bottom electrode is recessed using at least one of ion beam etching and isotropic etching.

\* \* \* \* \*